United States Patent [19]

Nonogaki et al.

[11] 4,273,842
[45] Jun. 16, 1981

[54] PROCESS FOR FORMING PATTERNWISE COATED POWDER LAYER

[75] Inventors: Saburo Nonogaki; Hajime Morishita, both of Tokyo; Michiaki Hashimoto, Kokubunji; Toshikatsu Manabe, Ome; Yoshifumi Tomita; Masahiro Nishizawa, both of Mobara, all of Japan

[73] Assignee: Hitachi, Ltd., Tokyo, Japan

[21] Appl. No.: 895,372

[22] Filed: Apr. 11, 1978

[30] Foreign Application Priority Data

Apr. 13, 1977 [JP] Japan .................. 52-41465
Oct. 14, 1977 [JP] Japan ................. 52-122390

[51] Int. Cl.³ ............................................. G03C 5/00
[52] U.S. Cl. ................................. 430/25; 427/54.1; 430/26; 430/28; 430/29
[58] Field of Search .................. 96/36.1, 91 R, 115 R; 427/54, 64, 68, 108, 205, 207 A, 240; 430/144, 23, 25, 28, 26, 29, 291

[56] References Cited

U.S. PATENT DOCUMENTS

| T875,016 | 6/1970 | Stahly | 430/144 |
|---|---|---|---|
| 3,481,733 | 12/1969 | Evans | 430/28 |
| 3,511,654 | 5/1970 | Kishiada et al. | 430/144 |
| 3,681,066 | 8/1972 | McGuckin | 96/49 X |
| 3,704,124 | 11/1972 | Conat | 96/49 X |
| 3,753,710 | 8/1973 | Jones et al. | 430/28 |
| 3,881,928 | 5/1975 | Gravesteijn et al. | 96/36.1 |
| 3,915,707 | 10/1975 | Gesswein et al. | 96/36.1 |
| 3,965,278 | 6/1976 | Duinker et al. | 427/54 |
| 3,981,729 | 9/1976 | Saulnier | 427/68 X |
| 3,997,344 | 12/1976 | Schlesinger et al. | 96/49 X |
| 4,019,905 | 4/1977 | Tomita et al. | 427/68 X |
| 4,049,452 | 9/1977 | Nekut | 427/68 X |
| 4,100,321 | 7/1978 | Schlesinger et al. | 430/144 X |
| 4,137,340 | 1/1979 | Verlinden et al. | 427/207 A X |

FOREIGN PATENT DOCUMENTS

| 674408 | 12/1966 | Belgium | 96/49 |
|---|---|---|---|
| 2145798 | 4/1972 | Fed. Rep. of Germany | 427/68 |
| 1103864 | 2/1968 | United Kingdom | 96/49 |
| 1103865 | 2/1968 | United Kingdom | 96/49 |
| 1105112 | 3/1968 | United Kingdom | 96/49 |

Primary Examiner—Ronald H. Smith
Assistant Examiner—Thurman K. Page
Attorney, Agent, or Firm—Craig and Antonelli

[57] ABSTRACT

A patternwise coated powder layer can be formed by a process comprising the steps of coating a photosensitive composition, which contains an aromatic diazonium salt as a photosensitive component and becomes sticky by exposure, onto the surface of a substrate to form a thin layer, subjecting the thin layer to patternwise exposure with actinic radiation to produce stickiness at the exposed area, and then contacting powder particles with the thin layer after exposure to make the thin layer to accept the powder particles according to the powder acceptability of the thin layer. According to this process, for example, the phosphor screen of a color picture tube can simply be produced.

42 Claims, 21 Drawing Figures

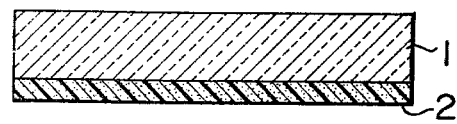
FIG. IA
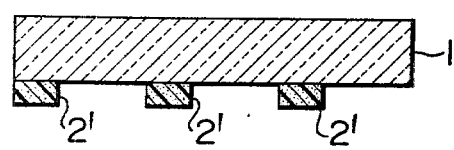
FIG. IB
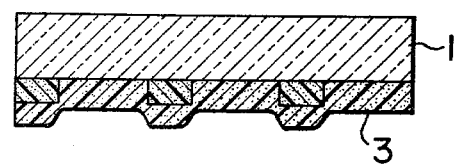
FIG. IC
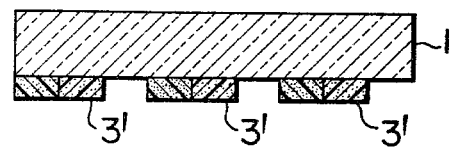
FIG. ID
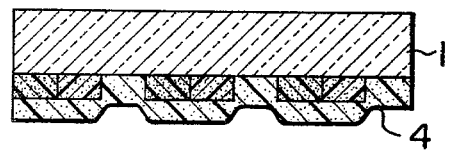
FIG. IE
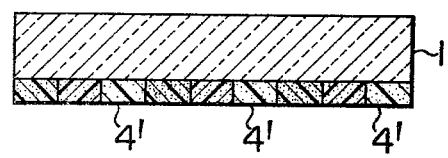
FIG. IF

PROCESS FOR FORMING PATTERNWISE COATED POWDER LAYER

LIST OF PRIOR ART (37 CFR 1.56 (a))

The following reference is cited to show the state of the art:

Japanese Patent Laid-Open Publication No. 47-7266 (1972)

BACKGROUND OF THE INVENTION

The present invention relates to a process for forming a patternwise coated powder layer. Particularly, the invention pertains to a process for forming a patternwise coated powder layer, which process is suited to the production of the phosphor screen of a color picture tube.

As a process for forming a patternwise coated powder layer, processes which comprise using powder as a dispersion or mixture thereof wherein powder has been dispersed in a dispersion medium such as water have heretofore been general. In such a case, a uniform dispersion has first been formed, and the dispersion has then been stored in a uniform state and coated to form a patternwise coated powder layer through complicated steps.

Referring to FIGS. 1-A to 1-F in the accompanying drawing, the formation of red, green and blue light-emitting phosphor layers on the inner surface of the face plate of a color picture tube according to one example of such prior art processes will be explained below.

As is shown in FIG. 1-A, a layer (2) is formed by coating the inner surface of the face plate (1) with a uniform mixture of a first color phosphor, for example, a green light-emitting phosphor and a photosensitive resin solution comprising a photosensitive resin, for example, polyvinyl alcohol and ammonium dichromate and then drying the resulting coating. The layer (2) is exposed to ultraviolet light through the apertures of a shadow mask. Here, the ultraviolet-light-irradiated position corresponds to an incident area of electron beams for exciting the phosphor, that is, the position to which the phosphor is to be bound. The photosensitive resin at the exposed area becomes insoluble and thereby the whole layer at the area becomes insoluble. The layer (2) is then washed with a solvent (usually water). Thus, as shown in FIG. 1-B, only the layer (2') which has become insoluble by exposure to ultraviolet light remains on inner surface of the face plate and the other layer is dissolved off. Thereafter, a layer (3) of a mixture of a second color phosphor, for example, a blue light-emitting phosphor and a photosensitive resin is formed by the same operations as described above as shown in FIG. 1-C. The layer (3) is then exposed to ultraviolet light and washed with water. Thus, as shown in FIG. 1-D, an insolubilized layer (3') remains on the inner surface of the face plate. Further, as shown in FIG. 1-E, a layer (4) of a mixture of a third color phosphor, that is, a red color-emitting phosphor and a photosensitive resin is formed by the same operations. The layer (4) is then exposed to ultraviolet light and washed with water. Thus, as shown in FIG. 1-F, an insolubilized layer (4') remains on the inner surface of the face plate.

As is clear from the above explanation, the steps of producing the phosphor screen of a color picture tube are complicated. Further, many times repetition of wet coating, washing with water and drying is required. It gives rise to various technical problems in each step and is very disadvantageous from an economical point of view.

On the other hand, a simple process which comprises coating powder itself is known from Japanese Patent Laid-Open Publication No. 47-7,266 (1972). According to this process, a supporter for a phosphor screen is coated by a photosensitive lacquer layer, the surface of which is sticky before exposure but loses stickiness by exposure, the area of the photosensitive lacquer layer where the phosphor screen is to be formed is exposed, a light-absorbing material powder which may be bound to the unexposed area is coated onto the layer, said exposed area is washed to remove the excess, unbound light-absorbing material, and finally phosphor screens which emit respectively different color lights are provided.

However, the photosensitive lacquer layer used in this process loses stickiness at its once exposed area. Therefore, it is impossible to coat three phosphors onto the same photosensitive lacquer layer successively. Thus, this process is only a process for forming a light-absorbing material layer (a so-called black matrix), and it is not suitable for forming the phosphor screen.

Further, as the photosensitive lacquer used in this process, "Kodak Mordant Cermitax" manufactured by Eastman Kodak Co. is known. However, this photosensitive lacquer has a defect in that its sensitivity is very low. Therefore, a long time is required for exposure and it is very disadvantageous from a commercial point of view. Further, the photosensitive lacquer is insoluble in water and is soluble only in organic solvents. However, the use of organic solvents on a commercial scale is disadvantageous since vapors of many organic solvents are toxic to a human being and are inflammable.

BRIEF DESCRIPTION OF THE INVENTION

An object of the present invention is to provide a novel process for forming a patternwise coated powder layer.

Another object of the invention pertains to provide a process for forming the phosphor screen of a color picture tube by remarkably simple steps.

Another object of the invention relates to provide a process for forming a phosphor screen according to which a black stripe-type phosphor screen having edge sharpness of black stripe thereof can be obtained.

The other objects and advantages of the present invention will be apparent from the following description.

According to the present invention, there is provided a process for forming a patternwise coated powder layer on the surface of a substrate which comprises:

(1) the first step of coating on the surface of the substrate a photosensitive composition, which may become sticky by exposure, to form a thin layer;

(2) the second step of subjecting the thin layer to patternwise exposure to produce stickiness at the exposed area; and (3) the third step of contacting powder particles with the thin layer after exposure to make the thin layer accept the powder particles according to the powder acceptability of the thin layer.

BRIEF DESCRIPTION OF DRAWING

FIGS. 1-A to 1-F are diagrams illustrating a prior art process.

DETAILED DESCRIPTION OF THE INVENTION

As a photosensitive composition which may become sticky by exposure in the present invention, aromatic diazonium salts alone or compositions containing an aromatic diazonium salt as a photosensitive component may be used.

Figure 2A:
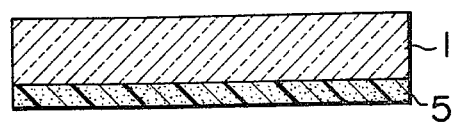
FIGS. 2-A to 2-D, 3-A to 3-F and 4-A to 4-E are respectively diagrams illustrating the process according to the present invention.
Figure 2B:
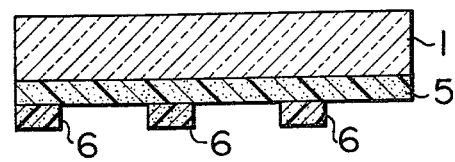
Figure 2C:
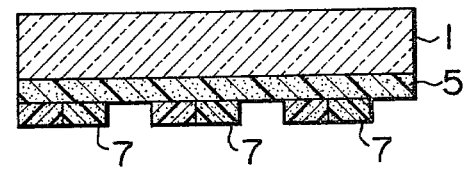
Figure 2D:
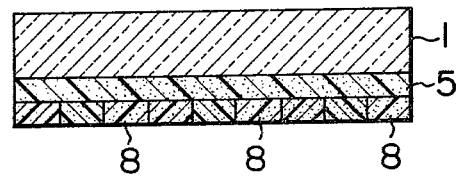

With regard to a process for producing the phosphor screen of a color picture tube, the outline of the present invention will be explained below. FIGS. 2-A to 2-D illustrate the steps in an application of the present invention to a process for producing the phosphor screen of a color picture tube. As shown in FIG. 2-A as a sectional view, a diazonium salt alone or a mixture of a diazonium salt and another substance is first coated onto the inner surface of the face plate (1) of a color picture tube to form a thin layer (5). In this case, the thin layer-forming material is dissolved in water or an organic solvent such as an alcohol. The resulting solution is coated onto the face plate and then dried to form a solid thin layer. The thin layer (5) is then exposed to ultraviolet light through the apertures of a shadow mask. In this case, the ultraviolet-light-irradiated position corresponds to the position whereonto a first color phosphor, for example, a green light-emitting phosphor, is to be coated. The thin layer at the exposed area becomes sticky due to the photodecomposition reaction of a diazonium salt. The first color phosphor particles are then contacted with this thin layer. According to the phosphor acceptability of the thin layer, the phosphor particles are bound to the thin layer. The excess and unbound phosphor particles are removed from the surface of the thin layer by a means, for example, by blowing air. Thus, as shown in FIG. 2-B, a coated phosphor layer (6) is formed on the thin layer at the exposed area. Thereafter, as shown in FIG. 2-C, a coating layer (7) of a second phosphor, for example, a blue light-emitting phosphor, is formed by similar procedures. Further, as shown in FIG. 2-D, a coating layer (8) of a third color phosphor, for example, a red light-emitting phosphor, is formed by similar procedures. Thus, a face plate is obtained wherein three light-emitting phosphors have been coated respectively at the incident area of electron beams for exciting the phosphors.

According to the present invention, the phosphor coating of a color picture tube can efficiently be carried out in a remarkably simpler manner as compared with prior art processes and using a very small amount of water.

Further, in order to produce a stripe-type black matrix color picture tube, a black matrix pattern can be formed by exposing, according to the present invention, through a shadow mask for a color picture tube so that light may be thrown on the position at which a black matrix light-absorbing layer is to be formed.

It has been found that the powder particles acceptability of a thin layer, that is, stickiness, increases when an aromatic diazonium salt alone or a mixture thereof with another substance such as gum arabic is coated onto the surface of a substrate such as a glass plate to form a thin layer and the thin layer is exposed to light. The present invention has been completed on the basis of this finding. The details of the reason for said increase in stickiness is not clear, but the reason is considered to be as follows:

The diazonium salt is decomposed by exposure and the resultant substance is hygroscopic. This substance absorbs moisture in the air and becomes sticky. For example, a double salt of a diazonium salt and zinc chloride is decomposed to liberate zinc chloride which is remarkably hygroscopic. Also, by the decomposition of a diazonium tetrafluoroborate, hygroscopic boron trifluoride is formed. Further, by the decomposition of a diazonium hydrogen sulfate, sulfuric acid is formed. The decomposition product is also remarkably hydroscopic.

As is understood from the above explanation, in order that the thin layer becomes sticky, it is required for the atmosphere to contain moisture. Preferable is a relative humidity of 10 to 70%. More preferable is a relative humidity of 30 to 70%. Since air is usually under or near such a condition, the present invention may usually be carried out in the air.

In order that a layer containing a diazonium salt is subjected to patternwise exposure and thereby the exposed area becomes remarkably sticky as compared with the unexposed area, the layer must not be already sticky from the beginning. As a result of many experiments, it has been found that, if the diazonium salt is in a crystalline state on the surface of the diazonium salt-containing layer, the surface is not sticky before exposure and becomes sticky by exposure. It can be found by the observation of the surface of the layer through a magnifying glass whether or not crystals exist on the surface of the layer. Particularly, is observed with polarized light, the presence of crystals on the layer can easily be found since the crystals show a mosaic-like form crystals. As described below in detail, a mixture of a diazonium salt and a polymer compound can be used as a photosensitive composition. In this case, if the amount of the diazonium salt contained in the mixture is small, the formation of diazonium salt crystals is retarded or the crystals are not formed. It is also found that the surface of the layer is already sticky as it is before exposure but becomes unsticky by exposure if diazonium salt crystals do not exist on the surface of the layer.

As said diazonium salt, any aromatic diazonium salt which may be decomposed by light exposure may be used in the present invention. Diazonium salts which are particularly useful in the present invention are stabilized aromatic diazoniums such as aromatic diazonium tetrafluoroborates, aromatic diazonium hydrogen sulfates, aromatic diazonium sulfonates and double salts of an aromatic diazonium chloride and zinc chloride.

These compounds will be explained below in detail.

Double salts of an aromatic diazonium chloride and zinc chloride are represented by the general formula

wherein $\phi$ is an aryl radical and n is a number of 1 or ½. Specific examples of such compounds include:
p-Diazodimethylaniline chloride-zinc chloride double salt [$(CH_3)_2NC_6H_4N_2Cl.ZnCl_2$]
p-Diazodiethylaniline chloride-zinc chloride double salt [$(C_2H_5)_2NC_6H_4N_2Cl.ZnCl_2$]
p-Diazoethylhydroxyethylaniline chloride-zinc chloride double salt [$HOC_2H_4(C_2H_5)NC_6H_4N_2Cl.\frac{1}{2}ZnCl_2$]

1-Diazoanthraquinone chloride-zinc chloride double salt ($C_{14}H_7O_2N_2Cl\cdot\frac{1}{2}ZnCl_2$)

2-Diazo-5-nitroanisole chloride-zinc chloride double salt [$O_2NC_6H_3(OCH_3)N_2Cl\cdot\frac{1}{2}ZnCl_2$]

1-Diazo-4-nitronaphthalene chloride-zinc chloride double salt ($O_2NC_{10}H_6N_2Cl\cdot\frac{1}{2}ZnCl_2$)

p-Diazoanisole chloride-zinc chloride double salt ($CH_3OC_6H_4N_2Cl\cdot\frac{1}{2}ZnCl_2$)

o-Diazoanisole chloride-zinc chloride double salt ($CH_3OC_6H_4N_2Cl\cdot\frac{1}{2}ZnCl_2$)

Aromatic diazonium tetrafluoroborates are represented by the general formula $$\phi N_2BF_4$$

wherein $\phi$ is as defined above. Specific examples of such compounds include:
p-Diazodimethylaniline tetrafluoroborate
p-Diazodiethylaniline tetrafluoroborate
p-diazoethylhydroxyethylaniline tetrafluoroborate
p-Diazoanisole tetrafluoroborate
o-Diazoanisole tetrafluoroborate Aromatic diazonium hydrogen sulfates are represented by the general formula $$\phi N_2HSO_4$$

wherein $\phi$ is as defined above. Specific examples of such compounds include:
p-Diazodimethylaniline hydrogen sulfate
p-Diazodiethylaniline hydrogen sulfate
p-Diazodiphenylamine hydrogen sulfate Among these compounds, preferable are the following compounds:
p-Diazodimethylaniline chloride-zinc chloride double salt
p-Diazodiethylaniline chloride-zinc chloride double salt
p-Diazodimethylaniline tetrafluoroborate
p-Diazodiethylaniline tetrafluoroborate
p-Diazodiphenylamine hydrogen sulfate More preferable are the following two compounds:
p-Diazodimethylaniline chloride-zinc chloride double salt
p-Diazodiethylaniline chloride-zinc chloride double salt These compounds may be used alone or in admixture of two or more.

Also, as the substance used in the present invention is admixture with a diazonium salt, organic polymer compounds such as gum arabic, polyvinyl alcohol, polyacrylamide, poly(N-vinyl pyrrolidone), copolymers of acrylamide and diacetone acrylamide, copolymers of methyl vinyl ether and maleic anhydride, alginic acid, propylene glycol ester of alginic acid, polyvinyl acetate and novolac resins may be used. Among them, first eight organic polymer compounds are water-soluble and may preferably be used in the present invention. Of course, these compounds may also be used in admixture of two or more.

The objects of the use of these substances are to improve coating property on forming a thin layer of a photosensitive composition containing a diazonium salt as a photosensitive component, to improve the uniformity of the thin layer and to control the powder particles acceptability of the thin layer. It is preferable to mix these polymer compounds with a diazonium salt in an amount of 1 to 1000% by weight, and preferably 1 to 500% by weight, and most preferably 2 to 300% by weight, based on the weight of the diazonium salt. The more the polymer compounds contained, the more coating property is improved. If the amount of the polymer compounds contained is too large, however, the formation of diazonium salt crystals is retarded as described above.

In order to improve the coating property, various surface active agents may further be added. It is a known means to add a surface active agent to a composition in order to improve the coating property of the composition. All the surface active agents used in such a known means may be used in the present invention. The amount of the surface active agents added is preferably about 0.01% to about 1% by weight based on the weight of the diazonium salt.

In order to bind more powder onto the photosensitive thin layer, the following process can be carried out in the present invention:

After powder has once been bound onto the thin layer according to the above-mentioned process, the vapor of an alcohol and/or a ketone is contacted with the coated powder layer, the coated powder layer is dried, and then the same powder is again contacted with the coated powder layer. Thus, more of the same powder can be bound to the thin layer.

As the alcohol used in this process, methanol, ethanol, isopropyl alcohol and butyl alcohol may be used. As the ketone used in this process, acetone, methyl ethyl ketone and methyl isobutyl ketone may be used.

The powder used in the present invention may have any particle size so long as it is a usual powder. In general, powder having a particle size of about 0.01 to about 100 $\mu$m, and preferably about 4 to about 10 $\mu$m is used.

Further, the present invention includes a process which comprises binding powder firmly onto a thin layer by a mechanical means. For example, in the step of producing a color picture tube, a phosphor screen is coated with an organic polymer film after a coated powder layer was formed. The object of applying such a film is to give metallic luster to an aluminum film as a light-reflecting film when the aluminum film is formed on the surface of the phosphor screen by vacuum evaporation. It is desirable that the phosphor screen is mechanically firm in the step of applying this coating.

The first process for making the coated powder layer mechanically firm is to contact the vapor of a basic substance such as ammonia, hydrazine or an aliphatic amine with the coated powder layer. By this operation, the substance formed by exposure undergoes a change and thereby powder is bound to the thin layer more firmly. For example, the zinc chloride formed by exposure which is contained in a photosensitive layer or a phosphor layer is converted into zinc hydroxide, which binds firmly phosphor particles to a substrate and binds firmly phosphor particles to one another. As a result, the phosphor layer becomes mechanically firm.

A more practical process for carrying out this process is to contact the air passed through concentrated ammonia water (concentration 29% by weight) with the coated powder layer at a temperature of about 20° C. or more for 10 to 20 seconds.

The second process for making a coated powder layer mechanically firm is to keep the coated powder layer in a more humid atmosphere and then dry the layer. This process is effective when a mixture of a diazonium salt and a water-soluble polymer compound is used as a photosensitive composition. However, an effect is observed also when a diazonium salt alone is used as a photosensitive composition. The most practical process for carrying out this process is to contact air saturated with moisture with the coated powder layer for several seconds and then dry the layer.

In the coated powder layer obtained according to the present invention, the diazonium salt is decomposed in the baking step and has no bad influence.

Further, the present invention discloses a process for forming a patternwise coated powder layer which comprises coating a photoresist, which has a property to become sticky after being exposed and developed, onto the inner surface of a face plate, removing the photoresist outside the exposed area by subjecting the coated layer to patternwise exposure and then to development, and then binding powder onto the photoresist layer in a wet state. The wet state is maintained unless the coated powder layer is completely dried after development. As the photoresist, all of known photoresists may be used.

The present invention can be effectively utilized in many uses in addition to the above-mentioned application examples. For example, dry photography such as electrophotography which contains no electric charging step but contains at least exposure step and powder development step can be practiced according to the present invention.

As the powder to be bound onto a photosensitive thin layer, wide range of powdery materials such as powder of phosphors and inorganic and organic pigments and dyes may be used.

The following examples illustrate the present invention. In these examples, all parts and % are expressed by weight unless otherwise indicated.

EXAMPLE 1

An aqueous solution having the composition (1) as described below is coated onto the surface of a glass plate by spin coating method. The resulting coating is dried by infrared heating to form a photosensitive thin layer having a thickness of about 1 $\mu$m.

Composition (1)
  p-Diazodimethylaniline chloride-zinc chloride double salt: 1 part
  A surface active agent produced by condensing sodium naphthalenesulfonate with formaldehyde (manufactured by Kao-Atlas Co.; Demor MS): 0.01 part
  Water: 20 parts The photosensitive thin layer is exposed to light having an intensity of 50 mW/cm$^2$ from a super-high-pressure mercury lamp through the apertures of a shadow mask for a color picture tube for one minute. A green light-emitting phosphor is then coated on the surface of the photosensitive thin layer by dusting method in air having a relative humidity of 40%. Thus, the phosphor powder is spread on the surface of the thin layer, the phosphor powder is bound to the exposed area of the thin layer, and the excess phosphor particles are then removed by air spraying.

Thereafter, a portion of the area of the photosensitive thin layer other than the above-mentioned exposed area is exposed to light from the super-high-pressure mercury lamp through the apertures of the shadow mask, and a blue light-emitting phosphor is then coated by dusting method.

Further, the area of the photosensitive thin layer other than the already exposed areas is exposed to light by similar operations and a red light-emitting phosphor is coated.

Thus, a mosaic-like phosphor screen which is usable as the phosphor screen of a color picture tube can be produced. The screen weight of the phosphors is 2.0 to 2.5 mg/cm$^2$. Also, it is confirmed that the thus produced phosphor screen becomes water-insoluble by contacting it with a mixed gas of ammonia and aqueous vapor for several seconds.

EXAMPLE 2

A mosaic-like phosphor screen can be formed on a photosensitive thin layer having a thickness of about 2 $\mu$m by the same operations as in Example 1 except that the aqueous solution having the composition (1) in Example 1 is replaced by an aqueous solution having the following composition (2).

Composition (2)
  p-Diazodimethylaniline tetrafluoroborate: 3 parts
  Polyvinyl alcohol (manufactured by Kuraray Co., Ltd., Kurare Poval 224, average degree of polymerization 2400, degree of hydrolysis 88%): 10 parts
  Water: 300 parts

EXAMPLE 3

A mosaic-like phosphor screen can be formed on a photosensitive thin layer having a thickness of about 0.5 $\mu$m by the same operations as in Example 1 except that the aqueous solution having the composition (1) in Example 1 is replaced by an aqueous solution having the following composition (3):

Composition (3)
  1-Diazo-4-nitronaphthalene chloride-zinc chloride double salt: 1 part
  Polyvinyl alcohol (manufactured by Kuraray Co., Ltd., Kurare Poval 224): 2 parts
  Water: 60 parts

EXAMPLE 4

An aqueous solution having the composition (4) as described below is coated onto the surface of a glass plate by spin coating method. The resulting coating is dried by infrared heating to form a photosensitive thin layer having a thickness of 1 to 2 $\mu$m.

Composition (4)
  p-Diazodimethylaniline tetrafluoroborate: 1 part
  Water: 20 parts The photosensitive thin layer is exposed to light having an intensity of 50 mW/cm$^2$ from a super-high-pressure mercury lamp through the apertures of a shadow mask for a color picture tube for one minute. A green light-emitting phosphor for a color picture tube is then spread on the surface of the photosensitive thin layer, the phosphor particles are bound to the area having powder particles acceptability of the photosensitive layer, and the excess and unbound phosphor particles are then removed by air spraying. Thus, a phosphor screen wherein only the exposed area of the photosensitive thin layer has been coated with the phosphor is obtained.

EXAMPLE 5

The same operations as in Example 4 are carried out except that the aqueous solution having the composition (4) in Example 4 is replaced by nine aqueous solutions having the compositions (5) to (13) as described below. As a result, a phosphor screen wherein only the exposed area of the photosensitive thin layer has been coated with the phosphor is obtained when either of these aqueous solutions is used.

Composition (5)
p-Diazodimethylaniline tetrafluoroborate: 1 part
Gum arabic: 4 parts
Water: 80 parts Composition (6)
p-Diazodimethylaniline tetrafluoroborate: 1 part
Poly(N-vinylpyrrolidone) (manufactured by GAF Corp., Polyvinylpyrrolidone K-90): 3 parts
Water: 60 parts Composition (7)
p-Diazodimethylaniline tetrafluoroborate: 1 part
Copolymer of acrylamide and diacetone acrylamide (molar ratio of acrylamide to diacetone acrylamide 5:3, intrinsic viscosity in water at 25° C. $[\eta]=3.0$): 3 parts
Water: 60 parts Composition (8)
p-Diazonanisole chloride-zinc chloride double salt: 1 part
Water: 20 parts Composition (9)
p-Diazoanisole chloride-zinc chloride double salt: 1 part
Polyvinyl alcohol (manufactured by Kuraray Co., Ltd., Kurare Poval 224): 3 parts
Water: 60 parts Composition (10)
p-Diazodimethylaniline chloride-zinc chloride double salt: 1 part
Water: 20 parts Composition (11)
o-Diazoanisol chloride-zinc chloride double salt: 1 part
Water: 20 parts Composition (12)
4-Diazodiphenylamine hydrogen sulfate: 1 part
Water: 20 parts Composition (13)
4-Diazodiphenylamine hydrogen sulfate: 1 part
Gum arabic: 3 parts
Water: 60 parts

EXAMPLE 6

A phosphor screen wherein only the exposed area of the photosensitive thin layer has been selectively coated with the phosphor is obtained by carrying out the same operations as in Example 4 except that the aqueous solution having the composition (4) in Example 4 is replaced by the aqueous solution having the composition (2) in Example 2. Air at 36° C. saturated with water vapor is sprayed onto the phosphor screen at 20°–22° C. for several seconds to wet the phosphor layer and the photosensitive thin layer. These layers are then dried. Thus, the phosphor can be firmly bound onto the photosensitive thin layer.

EXAMPLE 7

A phosphor screen wherein only the exposed area of the photosensitive thin layer has been selectively coated with the phosphor is obtained by carrying out the same operations as in Example 4 except that the aqueous solution having the composition (4) in Example 4 is replaced by the aqueous solution having the composition (2) in Example 2. Air at 40° C. saturated with isopropyl alcohol is sprayed onto the photosensitive layer at 20°–22° C. for several seconds to wet the phosphor layer and the photosensitive thin layer with isopropyl alcohol. These layers are then dried. Powder of the same phosphor as that already coated is then contacted with the layer, the phosphor particles are bound onto the layer, and the excess and unbound phosphor particles are removed from the layer by air spraying. By the second dusting operation, the screen weight of the phosphor bound onto the exposed area of the photosensitive thin layer increases from 2.0 mg/cm² to 3.6 mg/cm².

EXAMPLE 8

The same operations as in Example 4 are carried out except that the aqueous solution having the composition (4) in Example 4 is replaced by the aqueous solution having the composition (2) in Example 2 and the phosphor particles is replaced by carbon powder, ferric oxide powder, cobalt blue powder, powder of Sudan III (organic pigment), indigo powder and Congo Red powder, respectively. When any of these powders is used, a coating layer wherein only the exposed area of the photosensitive thin layer has been coated with the respective powder is obtained.

EXAMPLE 9

Aqueous solutions having the compositions (14) and (15) as described below, respectively, are coated onto the surface of a face plate by spin coating method and the resulting coating is then dried by infrared heating to form a photosensitive thin layer having a thickness of about 1 μm.

Composition (14)
p-Diazodimethylaniline chloride-zinc chloride double salt: 5.00 parts
Copolymer of methyl vinyl ether and maleic anhydride (manufactured by G.A.F. Corp., Gantrez AN-179): 0.50 part
Block copolymer of propylene glycol and ethylene oxide (manufactured by Asahi Electro-Chemical Co., Ltd., nonionic surface active agent, Pluronic L-92): 0.01 part
Water: 94.49 parts Composition (15)
p-Diazodimethylaniline chloride-zinc chloride double salt: 5.00 parts
Propylene glycol ester of alginic acid (manufactured by Kimitsu Kagaku Kogyo K.K., Kimiloid): 0.50 part
Water: 94.49 parts A mosaic-like phosphor screen can be formed on the photosensitive thin layer by the same subsequent operations as in Example 1.

EXAMPLE 10

Figure 3A:
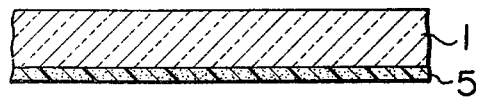
Figure 3B:
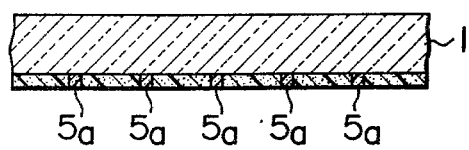
Figure 3C:
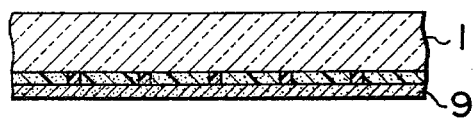
Figure 3D:
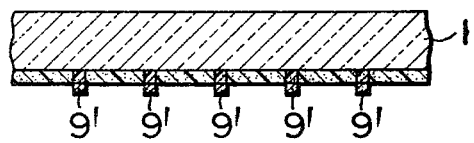
Figure 3E:
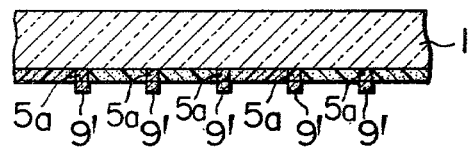
Figure 3F:
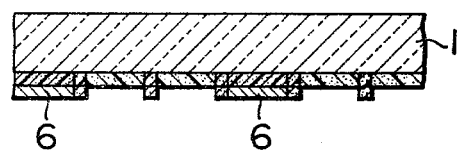

Referring to FIGS. 3-A to 3-F, this example will be explained below. As is shown in FIG. 3-A, a photosensitive agent (5) having the following composition, p-Diazodimethylaniline chloride-zinc chloride double salt: 4%
Propylene glycol ester of alginic acid: 0.4%
Sodium dodecylbenzenesulfonate: 0.004%
Ethyl alcohol: 3%
Deionized water: 92.596% is coated uniformly onto the inner surface of the face plate (1) of a 20-inch color picture tube to a film thickness of from 0.5 to 1.2 μm. The resulting coating is then exposed to light through a shadow mask (not shown). The distance P from a light source (not shown) to the shadow mask is 230 mm, the distance Q from the shadow mask to the photosensitive layer (5)—coated surface, that is, the inner surface of the face plate (1) is 12.10 mm, and the lateral pitch Bp of the shadow mask for stripe type is 0.77 mm. The exposure positions are shifted from the exposure positions of the phosphor screen of a usual stripe-type.

This shifting can be done by shifting the exposure light source from the position for exposing the area on which the phosphor stripes are to be formed, to lateral direction, i.e. parallel to the face plate and perpendicular to the phosphor stripes, by $$\frac{B_p \cdot P}{6Q} (1 + \frac{Q}{P}) \text{ mm}.$$

The exposure is carried out successively three times, corresponding to the three color types of phosphor stripes. Thus, the photosensitive layer is exposed stripe-wise, as shown in FIG. 3-B by 5a. In this case, it is necessary that the exposed area is narrower at the central part of the picture area of the face plate (1) but is broader at the peripheral part thereof. Therefore, the exposure is carried out by using the technology of controlling the size of a light source and a light intensity correcting filter. Specifically, the effective size of the light source is 2.2 mm$\phi$ and light intensity is 0.3 mW/cm$^2$ at the central part while the effective size of the light source is 1.2 mm$\phi$ and light intensity is 0.24 mW/cm$^2$ at the peripheral part. Each exposure is carried out for about 120 seconds. The photosensitive layer at the exposed area (5a) comes to have adhesive property due to the decomposition product of the diazonium compound. After exposure, the shadow mask is removed from the face plate (1) and graphite powder (9) having a particle size of about 0.5 to about 0.9 $\mu$m as a light-absorbing substance is sprayed onto the inner surface of the face plate (1). Thus, the graphite powder is bound onto the exposed photosensitive layer as is shown in FIG. 3-C. When air is then lightly blown onto the inner surface of the face plate (1), the graphite powder at the unexposed area is removed and, as a result, a black stripe pattern (9') is formed as is shown in FIG. 3-D. The light source (not shown) is shifted to the position corresponding to the position of the electron guns and a shadow mask is installed onto the face plate (1). Exposure is carried out for about 120 seconds at the effective size of the light source of 1.5 mm$\phi$ at both the central part and the peripheral part and at light intensity of 0.3 mW/cm$^2$ at the central part and 0.21 mW/cm$^2$ at the peripheral part. In this case, as is shown in FIG. 3-E, the photosensitive layer (5) at the previously unexposed area undergoes exposure and comes to have adhesive property and substance acceptability. After the exposure, the shadow mask is removed from the face plate (1). A green phosphor (6) is blown onto the inner surface of the face plate (1) and air is then lightly blown thereonto. Thus, the green phosphor at the unexposed area is removed and a green phosphor pattern is formed as is shown in FIG. 3-F. A black stripe-type phosphor screen is formed by repeating the same operation with regard to blue (B) and red (R). The black stripe-type phosphor screen is then exposed to ammonia vapor for 10 to 20 seconds to make it insoluble in water. The face plate (1) is subjected to filming with an organic coating and vacuum evaporation of aluminum to complete the phosphor screen.

According to such a forming process, a black stripe pattern and a phosphor pattern can be formed by a completely dry process. Therefore, the production steps can be remarkably simplified.

EXAMPLE 11

Figure 4A:
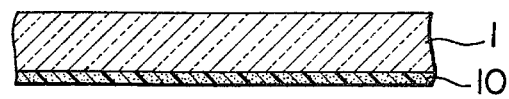
Figure 4B:
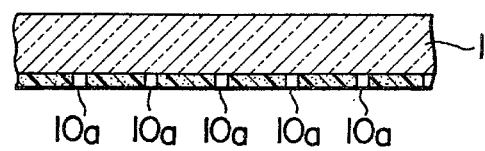
Figure 4C:
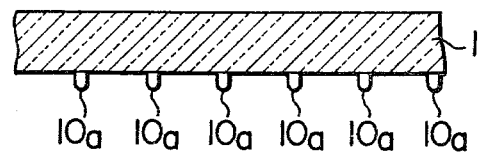
Figure 4D:
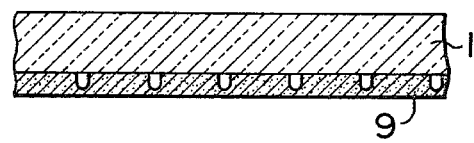
Figure 4E:
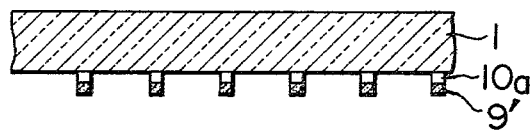

Referring to FIGS. 4-A to 4-E, this example is explained below. Onto the inner surface of a face plate (1), is coated to a film thickness of 0.5 to 1.2 $\mu$m a photosensitive agent consisting of:

Polyvinyl alcohol (degree of polymerization 2400, degree of saponification 88%): 3%
Ammonium bichromate: 0.15%
Ethylene glycol: 0.85%
Deionized water: 96%

A shadow mask (not shown) is installed onto the resulting coating and exposure is carried out, with the position of a light source being shifted from the positions of G, B and R electron guns by $$\frac{B_p \cdot P}{6Q} (1 + \frac{Q}{P}) \text{ mm}$$

wherein P, Q and $B_p$ are defined above, respectively, in the same manner as in Example 10. In the case, the effective size of a light source and light intensity are under the same conditions as in Example 10. Thus, as is shown in FIG. 4-B, the photosensitive layer after exposure (10a) is formed. After exposure, the shadow mask is removed and development is carried out with warm deionized water at 35°-40° C. for 120 seconds. Only the above-mentioned photosensitive layer (10a) remains and the photosensitive layer after development (10a) is formed as shown in FIG. 4-C. When the inner surface of the face plate is in a wet state, graphite powder (9) having a particle size of 0.5 to 0.9 $\mu$m as a light-absorbing substance is sprayed and then dried. After drying, development is again carried out with warm water at 35°-40° C. for 60 seconds. Thus, as is shown in FIG. 4-E, graphite powder is bound onto only the exposed area, that is, the above-mentioned photosensitive layer (10a) and a black stripe pattern (9') having the same size as in Example 10 is formed. On the surface of the thus formed black striped face plate (1), a phosphor screen is formed by dusting method or slurry method to complete a black stripe-type phosphor screen.

As explained above, according to the process for forming a phosphor screen according to Examples 10 and 11, a black stripe layer of a light-absorbing substance can easily be formed by simple steps. Also, since a black stripe pattern is formed prior to the formation of a phosphor screen, the excellent effect that the edge sharpness of the phosphor screen pattern is very good can be obtained.

What is claimed is:

1. A process for forming a patternwise coated layer on a phosphor screen of a color picture tube, which comprises:
   (1) a first step of applying a photosensitive composition containing an aromatic diazonium salt decomposable through exposure to ultraviolet light, whose photolytic product is hygroscopic, to an inside surface of a face plate of the color picture tube as a thin layer,
   (2) a second step of exposing the thin layer to ultraviolet light patternwise through a shadow mask, thereby making the exposed parts sticky due to the hygroscopicity of said photolytic product and absorption of moisture by said photolytic product, and then contacting powder particles with the thin layer, whereby the powder particles adhere to said exposed parts, which are sticky, and then removing residual powder particles from the thin layer, and (3) a third step of fixing the photolytic product resulting from the exposure to the ultraviolet light, thereby firmly binding the powder particles to said exposed parts.

2. A process according to claim 1, wherein said aromatic diazonium salt is at least one aromatic diazonium salt selected from the group consisting of:
p-diazodimethylaniline chloride-zinc chloride double salt,
p-diazodiethylaniline chloride-zinc chloride double salt,
p-diazoethylhydroxyethylaniline chloride-zinc chloride double salt,
1-diazoanthroquinone chloride-zinc chloride double salt,
2-diazo-5-nitroanisole chloride-zinc chloride double salt,
1-diazo-4-nitronaphthalene chloride-zinc chloride double salt,
p-diazoanisole chloride-zinc chloride double salt,
o-diazoanisole chloride-zinc chloride double salt,
p-diazodimethylaniline tetrafluoroborate,
p-diazodiethylaniline tetrafluoroborate,
p-diazoethylhydroxyethylaniline tetrafluoroborate,
p-diazoanisole tetrafluoroborate,
o-diazoanisole tetrafluoroborate,
p-diazodimethylaniline hydrogen sulfate,
p-diazodiethylaniline hydrogen sulfate, and
p-diazodiphenylamine hydrogen sulfate.

3. A process according to claim 2, wherein said aromatic diazonium salt is at least one member selected from the group consisting of:
p-diazodimethylaniline chloride-zinc chloride double salt,
p-diazodiethylaniline chloride-zinc chloride double salt,
p-diazodimethylaniline tetrafluoroborate,
p-diazodiethylaniline tetrafluoroborate and
p-diazodiphenylamine hydrogen sulfate.

4. A process according to claim 1, wherein the thin layer formed in the first step is a thin layer in which the aromatic diazonium salt is in a crystalline state.

5. A process according to claim 1, wherein said photosensitive composition is a photosensitive composition containing an aromatic diazonium salt and an organic polymer compound.

6. A process according to claim 5, wherein said photosensitive composition is a photosensitive composition consisting essentially of an aromatic diazonium salt and 1 to 1000% by weight of an organic polymer compound based on the weight of the aromatic diazonium salt.

7. A process according to claim 6, wherein the amount of said organic polymer compound is 1 to 500% by weight based on the weight of the aromatic diazonium salt.

8. A process according to claim 6, wherein said organic polymer compound is at least one member selected from the group consisting of gum arabic, polyvinyl alcohol, polyacrylamide, poly(N-vinylpyrrolidone), copolymers of acrylamide and diacetone acrylamide, copolymers of methyl vinyl ether and maleic anhydride, alginic acid, propylene glycol ester of alginic acid, polyvinyl acetate and novolac resins.

9. A process according to claim 6, wherein said organic polymer compound is a water-soluble polymer compound.

10. A process according to claim 5, wherein said aromatic diazonium salt is at least one member selected from the group consisting of:
p-diazodimethylaniline chloride-zinc chloride double salt,
p-diazodiethylaniline chloride-zinc chloride double salt,
p-diazoethylhydroxyethylaniline chloride-zinc chloride double salt,
1-diazoanthraquinone chloride-zinc chloride double salt,
2-diazo-5-nitroanisole chloride-zinc chloride double salt,
1-diazo-4-nitronaphthalene chloride-zinc chloride double salt,
p-diazoanisole chloride-zinc chloride double salt,
o-diazoanisole chloride-zinc chloride double salt,
p-diazodimethylaniline tetrafluoroborate,
p-diazodiethylaniline tetrafluoroborate,
p-diazoethylhydroxyethylaniline tetrafluoroborate,
p-diazoanisole tetrafluoroborate,
o-diazoanisole tetrafluoroborate,
p-diazodimethylaniline hydrogen sulfate,
p-diazodiethylaniline hydrogen sulfate and
p-diazodiphenylamine hydrogen sulfate.

11. A process according to claim 1, wherein said second step is carried out in an atmosphere having a relative humidity of 10 to 70%.

12. A process according to claim 1, wherein the fixing is carried out by contacting a vapor of a basic substance with said patternwise coated powder layer.

13. A process according to claim 12, wherein said basic substance is at least one member selected from the group consisting of ammonia, hydrazine and aliphatic amines.

14. A process according to claim 1, wherein the fixing is carried out by keeping said patternwise coated powder layer in a humid atmosphere and then drying the layer.

15. A process according to claim 1, wherein said exposure in said second step is made to form exposed parts at portions of said thin layer at which a black matrix light-absorbing layer is to be formed, said powder particles contacted with said thin layer are of a light-absorbing substance, and said patternwise coated powder layer formed is a stripe-type black matrix pattern.

16. A process according to claim 1, wherein in the removing of residual powder particles from the thin layer, the excess and unbound particles are removed from the thin layer, whereby a patternwise coated powder layer is formed.

17. A process according to claim 1, wherein said aromatic diazonium salt is at least one member selected from the group consisting of aromatic diazonium tetrafluoroborates, aromatic diazonium hydrogen sulfates, aromatic diazonium sulfonates and double salts of an aromatic diazonium chloride and zinc chloride.

18. A process according to claim 1, wherein said second step is carried out in an atmosphere of air.

19. A process according to claim 1, wherein said photosensitive composition further contains a surface active agent to improve the coating property of the thin layer formed from the photosensitive composition.

20. A process according to claim 5, wherein the photosensitive composition further contains a surface active agent, thereby improving a coating property of the thin layer formed from the photosensitive composition.

21. A process for forming a phosphor screen for a color picture tube which comprises:
  (1) the first step of coating on the inner surface of the face plate of a color picture tube a photosensitive composition containing an aromatic diazonium salt decomposable through exposure to ultraviolet light, whose photolytic product is hygroscopic, as a photosensitive component to form a thin layer;
  (2) the second step of subjecting the position of the thin layer to be coated with the first color phosphor to exposure to ultraviolet light through a shadow mask to produce stickiness at the exposed area;
  (3) the third step of contacting the first color phosphor with said thin layer to bind the phosphor onto the exposed area and then removing the excess and unbound phosphor from the surface of the thin layer;
  (4) the fourth step of subjecting the position of the thin layer to be coated with the second color phosphor to a second exposure to ultraviolet light through said shadow mask to produce stickiness at the second exposed area;
  (5) the fifth step of contacting the second color phosphor with said thin layer to bind the second color phosphor onto the second exposed area and then removing the excess and unbound phosphor from the surface of the thin layer;
  (6) the sixth step of subjecting the position of the thin layer to be coated with the third color phosphor to a third exposure to ultraviolet light through said shadow mask to produce stickiness at the third exposed area;
  (7) the seventh step of contacting the third color phosphor with said thin layer to bind the third phosphor onto the third exposed area and then removing the excess and unbound phosphor from the surface of the thin layer; and
  (8) the eighth step of fixing the photolytic product resulting from the exposures to the ultraviolet light, thereby firmly binding the powder particles to the exposed parts.

22. A process according to claim 21, wherein said photosensitive composition consists essentially of an aromatic diazonium salt and 1 to 1000% by weight of an organic polymer compound based on the weight of said aromatic diazonium salt.

23. A process according to claim 21, wherein said aromatic diazonium salt is at least one member selected from the group consisting of:
  p-diazodimethylaniline chloride-zinc chloride double salt,
  p-diazodiethylaniline chloride-zinc chloride double salt,
  p-diazoethylhydroxyethylaniline chloride-zinc chloride double salt,
  1-diazoanthraquinone chloride-zinc chloride double salt,
  2-diazo-5-nitroanisole chloride-zinc chloride double salt,
  1-diazo-4-nitronaphthalene chloride-zinc chloride double salt,
  p-diazoanisole chloride-zinc chloride double salt,
  o-diazoanisole chloride-zinc chloride double salt,
  p-diazodimethylaniline tetrafluoroborate,
  p-diazodiethylaniline tetrafluoroborate,
  p-diazoethylhydroxyethylaniline tetrafluoroborate,
  p-diazoanisole tetrafluoroborate,
  o-diazoanisole tetrafluoroborate,
  p-diazodimethylaniline hydrogen sulfate,
  p-diazodiethylaniline hydrogen sulfate, and
  p-diazodiphenylamine hydrogen sulfate.

24. A process according to claim 21, wherein said aromatic diazonium salt is at least one member selected from the group consisting of aromatic diazonium tetrafluoroborates, aromatic diazonium hydrogen sulfates, aromatic diazonium sulfonates and double salts of an aromatic diazonium chloride and zinc chloride.

25. A process according to claim 21, wherein said process consists essentially of steps (1)–(8).

26. A process according to claim 1, wherein said process consists essentially of steps (1)–(3).

27. In a process for forming a black matrix of a stripe-type black matrix color picture tube on an inner surface of a face panel of said color picture tube, said color picture tube being adapted to have a plurality of electron guns placed therein, a process for forming a black stripe pattern which comprises coating a photoresist on the inner surface of the face panel to form a coated layer consisting of said photoresist, subjecting the coated layer to exposure to ultraviolet light through a shadow mask at a position of the coated layer at which a black matrix light-absorbing layer is to be formed, wherein the position of the coated layer which is exposed is determined by placing a light source at positions shifted respectively from the positions where the plurality of electron guns for the color picture tube are placed, developing the exposed coated layer to thereby remove the photoresist at areas other than the exposed area and then depositing powders of light-absorbing substance on the photoresist at the exposed area in a wet state, whereby the powders stick to the photoresist at the exposed area.

28. A process for forming a black stripe pattern according to claim 27, wherein the position of the coated layer which is exposed is determined by placing a light source at positions shifted, respectively, from the positions where the plurality of electron guns for the color picture tube are placed by $$\frac{B_p \cdot P}{6Q} (1 + \frac{Q}{P}) \text{ mm},$$

wherein P is a distance from the light source to the shadow mask, Q is a distance from the shadow mask to the inner surface of the face plate, and $B_p$ is a lateral pitch of a shadow mask for stripe type.

29. A process for forming a black stripe pattern according to claim 28, wherein the color picture tube face panel is adapted to have phosphor stripes on an inner surface thereof, and wherein the light source is shifted from the positions where the plurality of electron guns for the color picture tube are placed in a direction parallel to the face panel and perpendicular to the phosphor stripes.

30. A process for forming a patternwise coated layer on a phosphor screen of a color picture tube comprising:

(1) a first step of applying a photosensitive composition containing an aromatic diazonium salt decomposable through exposure to ultraviolet light, whose photolytic product is hygroscopic, to an inside surface of a face plate of the color picture tube as a thin layer, (2) a second step of exposing the thin layer to ultraviolet light patternwise through a shadow mask, thereby making the exposed parts sticky due to the hygroscopicity of the photolytic product and absorption of moisture by said photolytic product, and then contacting powder particles with the thin layer, thereby making the exposed parts accept the powder particles, and then removing residual powder particles from the thin layer, (3) a third step of repeating at least once the second step of exposing contacting and removing, to form additional coated exposed parts and (4) a fourth step of fixing the photolytic product resulting from the exposures to the ultraviolet light, thereby firmly binding the powder particles to said exposed parts.

31. A process according to claim 30, wherein said aromatic diazonium salt is at least one aromatic diazonium salt selected from the group consisting of
p-diazodimethylaniline chloride-zinc chloride double salt,
p-diazodiethylaniline chloride-zinc chloride double salt,
p-diazoethylhydroxyethylaniline chloride-zinc chloride double salt,
1-diazoanthraquinone chloride-zinc chloride double salt,
2-diazo-5-nitroanisole chloride-zinc chloride double salt,
1-diazo-4-nitronaphthalene chloride-zinc chloride double salt,
p-diazoanisole chloride-zinc chloride double salt,
o-diazoanisole chloride-zinc chloride double salt,
p-diazodimethylaniline tetrafluoroborate,
p-diazodiethylaniline tetrafluoroborate,
p-diazoethylhydroxyethylaniline tetrafluoroborate,
p-diazoanisole tetrafluoroborate,
o-diazoanisole tetrafluoroborate,
p-diazodimethylaniline hydrogen sulfate,
p-diazodiethylaniline hydrogen sulfate, and
p-diazodiphenylamine hydrogen sulfate.

32. A process according to claim 30, wherein said photosensitive composition is a photosensitive composition containing an aromatic diazonium salt and an organic polymer compound.

33. A process according to claim 32, wherein said photosensitive composition is a photosensitive composition consisting essentially of an aromatic diazonium salt and 1 to 1000% by weight of an organic polymer compound based on the weight of the aromatic diazonium salt.

34. A process according to claim 33, wherein said organic polymer compound is at least one member selected from the group consisting of gum arabic, polyvinyl alcohol, polyacrylamide, poly(N-vinylpyrrolidone), copolymers of acrylamide and diacetone acrylamide, copolymers of methyl vinyl ether and maleic anhydride, alginic acid, propylene glycol ester of alginic acid, polyvinyl acetate and novolac resins.

35. A process according to claim 30, wherein said second step is carried out in an atmosphere having a relative humidity of 10 to 70%.

36. A process according to claim 30, wherein the fixing is carried out by contacting a vapor of a basic substance with the patternwise coated powder layer.

37. A process for forming a phosphor screen of stripe-type black matrix color picture tube, which comprises:

(1) a first step of applying a photosensitive composition containing an aromatic diazonium salt decomposable through exposure to ultraviolet light, whose photolytic product is hygroscopic, to an inside surface of a face plate of a color picture tube as a thin layer, (2) a second step of exposing positions of the thin layer, at which the stripe type black matrix light-absorbing layer is to be formed, to ultraviolet light patternwise through a shadow mask, thereby making the exposed positions sticky, due to the hygroscopicity of said photolytic product and absorption of moisture by said photolytic product, then contacting the thin layer with powder particles of light-absorbing material, thereby making the exposed positions accept the powder particles, and removing the residual powder particles from the thin layer, (3) a third step of secondly exposing positions of the thin layer, to which a phosphor of first color is to be applied, to ultraviolet light patternwise through the shadow mask, thereby making the secondly exposed positions sticky, then contacting the thin layer with a phosphor of the first color, thereby making the secondly exposed positions accept the phosphor of the first color, and removing residual phosphor from the thin layer, (4) a fourth step of thirdly exposing positions of the thin layer, to which a phosphor of second color is to be applied, to ultraviolet light patternwise through the shadow mask, thereby making the thirdly exposed positions sticky, then contacting the thin layer with a phosphor of second color, thereby making the thirdly exposed positions accept the phosphor of second color, and removing residual phosphor from the thin layer, (5) a fifth step of fourthly exposing positions of the thin layer, to which a phosphor of third color is to be applied, to ultraviolet light patternwise through the shadow mask, thereby making the fourthly exposed positions sticky, then contacting the thin layer with a phosphor of third color, thereby making the fourthly exposed positions accept the phosphor of third color, and removing residual phosphor from the thin layer, and (6) a sixth step of fixing the photolytic product resulting from the exposures to the ultraviolet light, thereby firmly binding the powder particles to the exposed positions.

38. A process according to claim 30, wherein said process consists essentially of steps (1)–(4).

39. A process according to claim 37, wherein said process consists essentially of steps (1)–(6).

40. A process according to claim 21, 1, 30 or 37, wherein said thin layer is substantially non-sticky.

41. A process for forming a patternwise coated layer on a phosphor screen of a color picture tube, which comprises:

(1) a first step of applying a photosensitive composition containing an aromatic diazonium salt decomposable through exposure to ultraviolet light, whose photolytic product is hygroscopic, to an inside surface of a face plate of the color picture tube as a thin layer, (2) a second step of exposing the thin layer to ultraviolet light patternwise through a shadow mask, thereby making the exposed parts sticky due to the hygroscopicity of said photolytic product and absorption of moisture by said photolytic product, and then contacting powder particles with the thin layer, whereby the powder particles adhere to said exposed parts, which are sticky, and then removing residual powder particles from the thin layer, (3) a third step of contacting vapor of an alcohol or ketone with said patternwise coated powder layer, and then contacting said powder particles again with said patternwise coated powder layer; and (4) a fourth step of fixing the photolytic product resulting from the exposure to the ultraviolet light, thereby firmly binding the powder particles to said exposed parts.

42. A process according to claim 41, wherein said alcohol or ketone is at least one member selected from the group consisting of methanol, ethanol, isopropyl alcohol, butyl alcohol, acetone, methyl ethyl ketone and methyl isobutyl ketone.

* * * * *